United States Patent [19]

Stauffer

[11] B 3,914,703

[45] Oct. 21, 1975

[54] HALF-BRIDGE AUDIO AMPLIFIER

[75] Inventor: Reuben Laverne Stauffer, Timonium, Md.

[73] Assignee: The Bendix Corporation, Southfield, Mich.

[22] Filed: Jan. 31, 1973

[21] Appl. No.: 328,164

[44] Published under the Trial Voluntary Protest Program on January 28, 1975 as document no. B 328,164.

Related U.S. Application Data

[63] Continuation of Ser. No. 51,259, June 30, 1970, abandoned.

[52] U.S. Cl. .................... 330/17; 330/13; 330/149

[51] Int. Cl.[2] ........................................ H03F 3/18

[58] Field of Search ........................ 330/13, 17, 149

[56] References Cited

UNITED STATES PATENTS

| | | | |
|---|---|---|---|
| 3,077,566 | 2/1963 | Vosteen | 330/17 X |
| 3,387,222 | 6/1968 | Hellwarth | 330/149 X |
| 3,566,291 | 2/1971 | Tice, Jr. | 330/149 X |

*Primary Examiner*—Alfred E. Smith
*Assistant Examiner*—Lawrence J. Dahl
*Attorney, Agent, or Firm*—W. G. Christoforo; Bruce L. Lamb

[57] ABSTRACT

A half bridge transistor audio amplifier circuit has a Class B complementary symmetry transistor amplifier and a Class B transfer amplifier whose idling current variations are cancelled.

9 Claims, 2 Drawing Figures

INVENTOR
REUBEN L. STAUFFER
BY
William G. Christoforo
ATTORNEY

INVENTOR
REUBEN L. STAUFFER
BY
William G. Christoforo
ATTORNEY

HALF-BRIDGE AUDIO AMPLIFIER

This is a continuation of application Ser. No. 51,259, filed June 30, 1970, now abandoned.

BACKGROUND OF THE INVENTION

This invention relates to amplifiers and more particularly to an audio amplifier having a class B half bridge complementary symmetry transistor amplifier output stage whose idling current and variations thereof are effectively prevented from reaching the output stage.

In the prior art, complementary symmetry output amplifiers have been employed to provide a single-ended power output amplifier for driving relatively low impedance load devices. A complementary symmetry amplifier may be described as an arrangement of a pair of transistors connected in series with one output transistor of the series pair being of one polarity type and the other output transistor of the pair being of the opposite polarity type. These prior art complementary symmetry amplifiers have been driven generally from a single-ended source applied to both bases of the complementary symmetry pair. Maximum voltage swing of the output signal from the complementary symmetry circuit has been accomplished by connecting the emitters of the transistors comprising the complementary symmetry circuit across the entire voltage supply. Such a connection of the emitters was made possible by the use of a transfer transistor or amplifier, essentially operating as a phase splitter so as to apply equal, but opposite, signals to the bases of the transistors of the complementary symmetry circuit. This arrangement operated as a class B amplifier which enabled the complementary symmetry circuit transistors to fully saturate or closely approach saturation. These prior art arrangements, however, permitted the idling current of the transfer amplifier to be applied as one component of the input to the complementary symmetry amplifier. Since variations in the idling current in the transfer amplifier are extremely difficult or impossible to eliminate the resultant amplified variations produced unsatisfactory distortions in the complementary symmetry amplifier output.

SUMMARY OF THE INVENTION

There is disclosed herein a new complementary symmetry circuit arrangement which overcomes the above mentioned disadvantage. As before, the emitters of the transistors comprising the complementary symmetry circuit are connected across the entire voltage supply, thus retaining the advantage of being able to swing the output signal voltage through the entire range, or essentially the entire range, of the voltage supply. Idling current is applied to the transistors of the complementary symmetry pair from a constant current source, thus preventing class B operation cross-over distortion in this amplifier stage. A class B transfer amplifier also connected across the entire voltage supply for maximum power output and which supplies the input to the complementary symmetry pair is also supplied with an idling current to prevent cross-over distortion therein. Additionally, the transfer amplifier is provided with a current inverter which provides a current equal to the idling current in the transfer amplifier and supplies this current to the inputs of the complementary symmetry amplifier in a direction to cancel from these inputs the idling current from the transfer amplifier.

It is an object of this invention to provide an amplifier to drive a low ohmic load with maximum possible undistorted power output.

It is another object of this invention to provide an amplifier whose output voltage swings through essentially the entire power supply voltage range.

It is a still further object of this invention to provide an audio amplifier of the type described which operates as a class B amplifier.

It is still another object of this invention to provide a class B audio amplifier wherein the idling current in one amplifier stage is cancelled in the output of that stage.

One further object of this invention is to provide a class B operating complementary symmetry audio amplifier curcuit which is driven by a class B operating transfer amplifier, both of the amplifier stages being supplied with idling current to eliminate cross-over distortion, the idling current in the transfer amplifier being cancelled from its output.

DESCRIPTION OF THE PREFERRED EMBODIMENT

Figure 1:
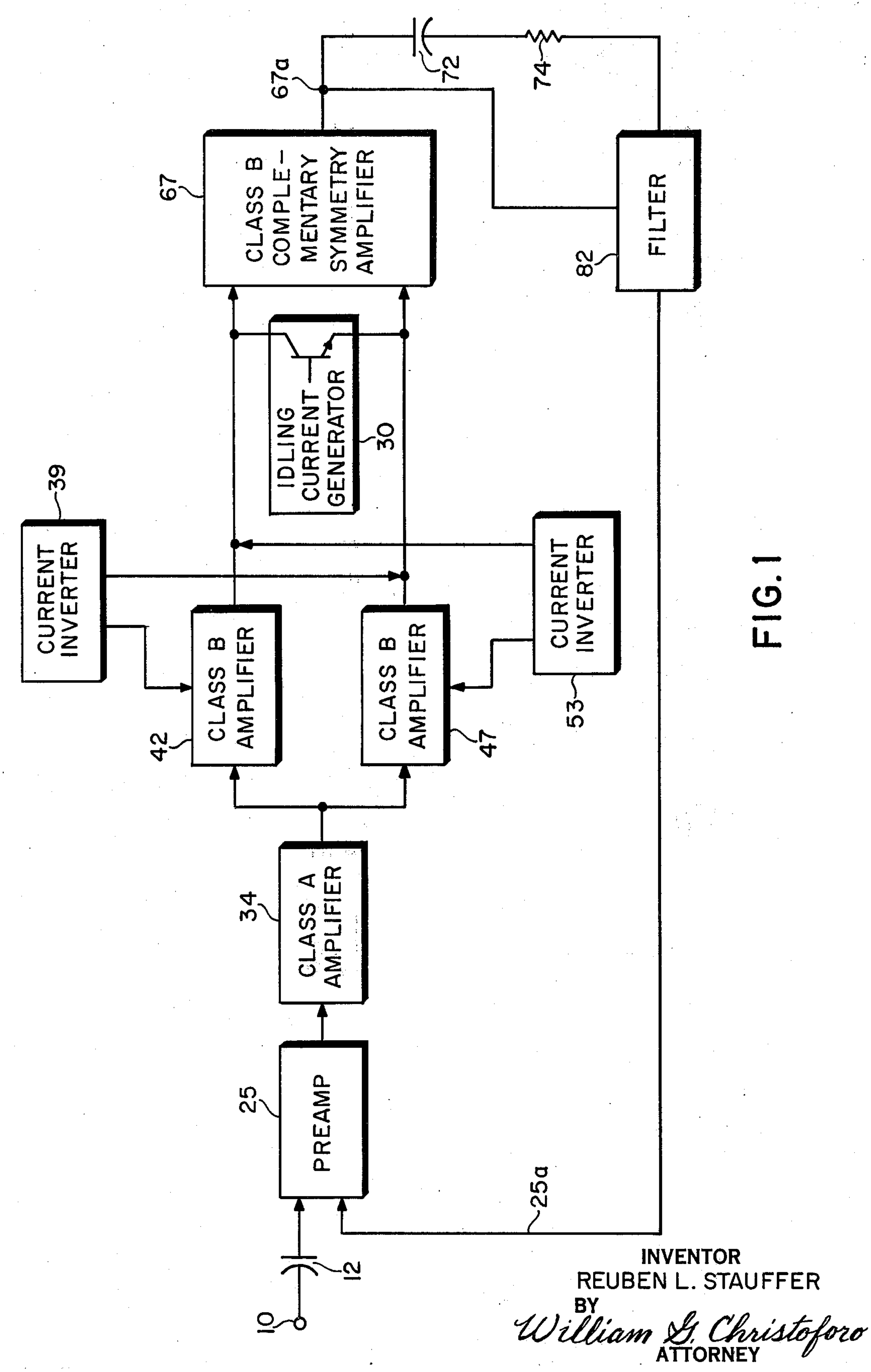
FIG. 1 is a block diagram of the basic features of the invention.

Referring to the figures wherein like numerals refer to identical elements and referring particularly to FIG. 1 an input audio signal is applied to terminal 10 and capacitively coupled through capacitor 12 to a preamplifier 25 wherein the signal is amplified. A feedback signal from the output tap **67*a* of complementary symmetry amplifier 67 is applied through filter 82 and line 25*a* to preamplifier 25 to stabilize the operation thereof. The amplified signal from preamplifier 25 is then applied to a class A amplifier 34, the output signal therefrom being applied to a class B transfer amplifier comprised of matched amplifiers 42 and 47 which operate in push-pull fashion. Idling current for amplifier 42 is supplied from current inverter 39 which supplies an equal current to the output of amplifier 47. A current inverter is a device which generates in a second leg thereof a current equal and in the same direction as the current drawn from the first leg. The second current inverter 53 supplies idling current to amplifier 47 and an equal current to the output of amplifier 42. Since amplifiers 42 and 47 are matched their outputs contain equal idling currents which are cancelled by the current supplied to their outputs by current inverters 39 and 53. Thus idling currents from these amplifiers are kept out of further amplification stages so that the idling currents and their variations are not amplified to produce distortion in a final output. A class B complementary symmetry amplifier 67 is supplied input signals from the transfer amplifier and idling current from idling current generator 30. As already noted, the output from amplifier 67 appears on terminal 67*a* where it is capacitively coupled through capacitor 72 to a load schematically represented at 74.**

Figure 2:
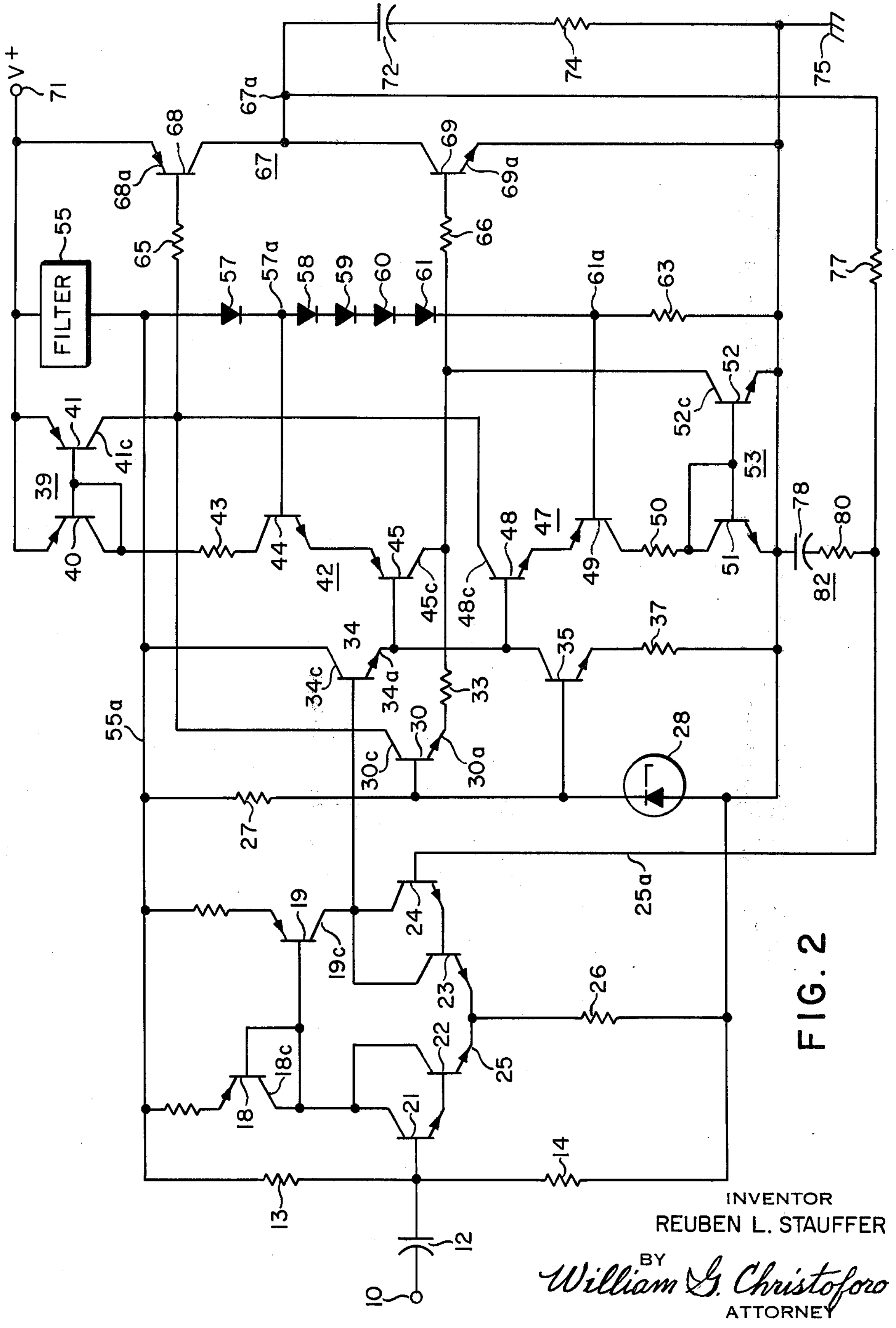
FIG. 2 is a circuit diagram of one embodiment of the invention employed as an audio amplifier.

Referring now to FIG. 2 where terminal 10 is connected to a source of audio signals (not shown) and connected through capacitor 12 to the base of transistor 21. Preamplifier 25 is seen to be comprised of transistors 21 to 24 differentially connected with the system feedback being applied via line 25a to the base electrode of transistor 24. The collectors of transistors 21 and 22 are commonly connected as are the collectors of transistors 23 and 24. The emitters of transistors 22 and 23 which are also commonly connected are connected through resistor 26 to ground terminal 75 which is the return terminal of the V+ voltage source applied to power terminal 71. Transistors 21 and 22 as well as transistors 23 and 24 are connected in a Darlington couple configuration, thus presenting a characteristically high input impedance at the base of transistors 21 and 24. The d.c. potential at the base of transistor 21 is determined by the voltage divider comprised of resistors 13 and 14 connected across the filtered power line 55a and ground. This d.c. voltage is reproduced at the base of transistor 24 and communicated therefrom to output terminal 67*a* via line 25*a* and resistor 77. Because of the high input impedance at the base of transistor 24, as previously explained, and the d.c. open circuit afforded by capacitor 78 of audio filter 82, negligible current flows through resistor 77 and hence, the d.c. potentials at output terminals 67*a*, and the bases of transistors 21 and 24 can be considered to be identical. As previously noted, it is desirable that the voltage at output terminal 67*a* swing through the entire range of the available voltage V+ for maximum power output. Accordingly, it is desirable that d.c. voltage at output terminals 67*a* be midway between voltage V+ and ground. To accomplish this resistors 13 and 14 are selected to be almost equal, with resistor 13 being somewhat smaller to compensate for the drop in voltage on filtered power line 55*a* produced by filter 55. Transistors 18 and 19 having commonly connected base electrodes and connected to the collector of transistor 18 comprise a current inverter wherein current drawn from collector 18*c* is reproduced as to magnitude and direction at collector 19*c*. Thus, the d.c. currents flowing in the two branches of differential amplifier 25 are identical so that this amplifier is balanced and the d.c. voltages at the bases of transistors 21 and 24 are accordingly equal as previously mentioned.

The output of this amplifier, which appears on the common collector connection of transistors 23 and 24, is directly connected to the base of transistor 34 which operates as a class A amplifier. Collector 34*c* is directly connected to the filtered powered line 55*a*, while emitter 34*a* is connected through the constant d.c. current generator comprised of transistor 35 and resistor 37 to ground. The base electrode of the constant current generator 35 is connected to the constant voltage source determined by Zener diode 28 and resistor 27.

A transfer amplifier is comprised of differentially connected amplifiers 42 and 47 which in turn are comprised respectively of transistors 44 and 45 and transistors 48 and 49. Amplifier 42 receives as one input, at the base of transistor 44, the voltage at terminal 57*a* produced by the divider comprised of diode 57 together with diodes 58 to 61 and resistor 63. The second input to amplifier 42, the signal input, is from the emitter of amplifier 34 to the base of transistor 45. In like manner the signal input to amplifier 47 is from the emitter of amplifier 34 to the base of transistor 48, while the second input to amplifier 47 is the voltage applied to the base of transistor 49 from terminal 61*a*. It will be noted that the base emitter diodes of transistors 44, 45, 48 and 49 are serially connected in parallel with the serially connected diodes 58 to 61 across terminals 57*a* and 61*a*. Accordingly, the transistors comprising amplifiers 42 and 47 are forward biased by the voltage across terminals 67*a* and 61*a* to thereby cause a d.c. quiescent or idling current to flow therethrough.

The output of amplifier 42, which appears at collector 45*c*, is coupled through resistor 66 to the base of transistor 69. In like manner the output of amplifier 47, which appears at collector 48*c*, is coupled through resistor 65 to the base of transistor 68. Transistors 68 and 69 together comprise a half bridge complementary symmetry amplifier having emitter electrodes 68a and 69a connected across the available power terminals 71 and 75. The complementary symmetry amplifier operates in a class B mode with idling current being supplied by the constant current generator comprised of resistor 33 and transistor 30 having a base electrode connected to a source of constant voltage determined by the serial connection of resistor 27 and Zener diode 28 connected between the filtered power line 55*a* and the ground terminal. As can be seen, collector 30*c* is connected to the junction of resistor 65 and collector 48*c* while emitter 30*a* is connected through resistor 33 to the junction of collector 45*c* and resistor 66.

The d.c. idling current flowing in the collector of transistor 44 also flows in the collector of transistor 40 which is serially connected therewith. Transistors 40 and 41 having commonly connected base electrodes connected to the collector of transistor 40 together comprise a current inverter 39 wherein the collector currents are equal and in the same direction. In like manner transistors 51 and 51 have commonly connected base electrodes connected to the collector of transistor 51 and thus also comprise a current inverter so that the current flowing in the collector of transistor 49 is identical to the current flowing in the collector of transistor 51. Resistors 43 and 50 located in the collector circuits of transistors 44 and 49, respectively, are current limiting resistors. It should now be obvious that if transistors 44 and 48 and transistors 45 and 49 together with transistors 40, 41, 51 and 52 are properly matched the idling current in amplifier 42 and which appears at an output connection 45c is compensated for by the connection of the collector electrode 52c of current inverter 53 thereto. In like manner the idling current in amplifier 47 which appears at output terminal 48*c* is compensated for by the connection of collector 41*c* of current inverter 39 thereto. Thus, the idling currents in the transfer amplifier are not transferred to the complementary symmetry amplifier 67.

As has been mentioned, both the complementary symmetry output amplifier and the transfer amplifier are connected across the entire voltage supply. Thus, means other than filtering, which would reduce the available supply voltage, must be resorted to to prevent supply voltage noise from entering into the amplifier output. Supply voltage noise immunity is accordingly provided by connecting the base terminals of all transistors whose emitter terminals are connected to unfiltered voltage to a high impedance. In this manner noise base currents are suppressed.

The output appears at terminal 67*a*. It has previously been explained that the d.c. potential at terminal 67*a* is midway between potential V+ and ground. The amplified output is capacitively coupled through capacitor 72, to remove the d.c. component, to the load 74.

The audio filter 82 comprised of resistors 77 and 80 and capacitor 78 is a d.c. open circuit between feedback line 25*a* and ground as previously noted, and a short circuit to frequencies at the mid-range of the desired band. Roll off of this filter, of course, determines the roll off of the overall system transfer function at the extreme ends of the band.

Power for preamplifier 25 and amplifier 34 is received from filtered power line 55a to prevent perturbations of the power source voltage from being amplified in subsequent amplifier stages. Since the power line filter attenuates the available voltage somewhat the transfer amplifier and complementary symmetry output amplifier have been connected across the unfiltered power line to provide maximum possible output power. Power line noise is kept out of the last two stages by connecting the base electrodes of those transistros whose emitters are connected to the unfiltered power terminal 71 to a high impedance. Three transistors of the last two stages are involved, transistors 40, 41 and 68. In the case of transistors 40 and 41, their base electrodes are connected in common and through resistor 43 to the high impedance connection at the collector of transistor 44. Similarly, the base electrode of transistor 68 is connected through resistor 65 to the high source impedance terminal common to the collectors of transistors 30, 41 and 48. Since these base electrodes are connected to a high impedance, noise on voltage terminal 71 will, of course, result in corresponding noise voltage at the transistor base due to the clamping effect of the base-emitter junction. However, because of the high impedance, no or negligible noise base current will result, thus no or negligible noise induced current will flow in the transistor emitter-collector circuit.

Although I have described this invention with reference to an audio amplifier, the teaching contained herein will be found to be applicable to other embodiments by persons skilled in the art. Accordingly, I claim all subject matter encompassed within the scope and spirit of the appended claims.

The invention claimed is:

1. Means for amplifying an input frequency signal including an output terminal on which the amplified frequency signal appears comprising:

a voltage source;

a complementary symmetry transistor amplifier including a first transistor and a second transistor of opposite polarity having commonly connected collector electrodes comprising said output terminal, emitter electrodes connected across said voltage source, and first and second control electrode means;

transfer amplifier means for applying said input frequency signal to said first and second control electrode means of said first and second transistors;

means for supplying quiescent current to said transfer amplifier means whereby said quiescent current flows in said transfer amplifier means and is applied to said first and second control electrode means of said first and second transistors;

means for generating a second current equal to said quiescent current and for applying said second current to said first and second control electrode means in a direction to cancel said supplied quiescent current therefrom.

2. Means for amplifying an input frequency signal as recited in claim 1 wherein said transfer amplifier means comprises:

a first amplifier comprising a third transistor having a base electrode connected to receive said input frequency signal, a collector electrode connected to said first control electrode means and an emitter electrode and, a fourth transistor having base and collector electrodes and an emitter electrode connected to said third transistor emitter electrode;

a second amplifier comprising a fifth transistor having a base electrode connected to receive said input frequency signal, a collector electrode connected to said second control electrode means and an emitter electrode; and, a sixth transistor having base and collector electrodes and an emitter electrode connected to said fifth transistor emitter electrode; said means for supplying quiescent current being connected to said fourth and sixth transistor collector electrodes; and wherein said means for supplying quiescent current includes voltage means connected across said fourth and sixth transistor base electrodes whereby said quiescent current is caused to flow.

3. Means for amplifying an input frequency signal as recited in claim 2 wherein said quiescent current is comprised of first and second components, said first component being supplied to said first amplifier and said second current component being supplied to said second amplifier, and wherein said second current is comprised of third and fourth components, said third component being applied to said first control electrode means and said fourth component being applied to said second control electrode means and wherein said means for generating and said means for supplying comprise:

a first current inverter for generating said first component and said third component equal to said first component; and, a second current inverter for generating said second component and said fourth component equal to said second component.

4. Amplifying means comprising:

a voltage source having first and second terminals;

a complementary symmetry transistor amplifier including a first transistor having first base, emitter and collector electrodes and a second transistor of opposite polarity having second base, emitter and collector electrodes, said collector electrodes being connected in common, said first emitter electrode being connected to said first terminal and said second emitter electrode being connected to said second terminal, means for applying a signal to be amplified to said complementary symmetry transistor amplifier pair, said means for applying including first and second output terminals, at least said second output terminal being characterized by a high source impedance, said first and second output terminals being connected to said first and second base electrodes of said first and second transistors respectively;

means for generating a quiescent current in said applying means;

means responsive to said quiescent current for generating an equal current and for communicating said equal current to said first and second output terminals so as to cancel said generated quiescent current therefrom.

5. Amplifying means as recited in claim 4 wherein said means for applying comprises a class B transfer amplifier means including an input terminal for receiving said signal to be amplified and said first and second output terminals.

6. Amplifying means as recited in claim 5 wherein said transfer amplifier means comprises:

a first differential transistor amplifier comprising a third transistor having a base electrode connected to said input terminal and a differentially connected fourth transistor having a base electrode, said first differential amplifier including said first output terminal;

a second differential transistor amplifier comprising a fifth transistor having a base electrode connected to said input terminal and a differentially connected sixth transistor having a base electrode; said second differential amplifier including said second output terminal; and wherein said means for generating a quiescent current comprises:

a source of quiescent current for said first and second differential amplifiers; and, a source of forward bias connected across said fourth and sixth transistor base electrodes whereby said quiescent current is biased to flow in said first and second differential amplifiers, said quiescent current thereby appearing at said first and second output terminals.

7. Amplifying means as recited in claim 6 wherein said fifth transistor includes a collector electrode comprising said second output terminal.

8. Amplifying means as recited in claim 5 wherein said transfer amplifier comprises:

a first differential amplifier comprising a third transistor having a base electrode connected to receive said signal and a collector electrode comprising said first output terminal, and a differentially connected fourth transistor having a base electrode;

a second differential amplifier comprising a fifth transistor having a base electrode connected to receive said signal and a collector electrode comprising said second output terminal, and a differentially connected sixth transistor having a base electrode; and wherein said means for generating a quiescent current includes a source of voltage difference connected across said fourth and sixth transistor base electrodes.

9. Amplifying means as recited in claim 8 wherein said fourth and sixth transistors have collector electrodes and wherein such quiescent current includes first and second components and said equal current includes third and fourth components and wherein said means for generating a quiescent current additionally includes:

a source of said first component for said first differential amplifier connected to said fourth collector electrode;

a source of said second component for said second differential amplifier connected to said sixth collector electrode, said voltage difference causing said first and second components to flow in said first and second differential amplifiers and to thereby appear at said first and second output terminals respectively; and wherein said means for generating an equal current comprises:

means for generating said third component essentially equal to said first component; and, means for generating said fourth component essentially equal to said second component, said third and fourth components comprising said equal current and being applied respectively to said first and second output terminals to cancel the first and second components thereat.

* * * * *